(12) United States Patent
O'Brien et al.

(10) Patent No.: US 6,215,134 B1
(45) Date of Patent: Apr. 10, 2001

(54) SEMICONDUCTOR SURFACE LENSES AND SHAPED STRUCTURES

(75) Inventors: John O'Brien; Chaun-cheng Cheng, both of Pasadena; Axel Scherer, Laguna Beach; Amnon Yariv, San Marino; Yong Xu, Pasadena, all of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/075,744

(22) Filed: May 8, 1998

Related U.S. Application Data

(60) Provisional application No. 60/046,054, filed on May 9, 1997.

(51) Int. Cl.[7] .................................................. H01L 33/00
(52) U.S. Cl. .................................. 257/98; 257/95; 257/94; 257/101
(58) Field of Search .............................. 257/79, 98, 101, 257/95, 94

(56) References Cited

U.S. PATENT DOCUMENTS

| 4,367,483 | * | 1/1983 | Takahashi et al. ...................... 257/98 |
| 5,633,527 | * | 5/1997 | Lear ........................................ 257/98 |

* cited by examiner

*Primary Examiner*—Minh Loan Tran
(74) *Attorney, Agent, or Firm*—Fish & Richardson P.C.

(57) ABSTRACT

A lens is formed out of semiconductor material. The semiconductor produces light which is coupled to the lens. The lens focuses the light and also minimizes refractive reflection. The lens is formed by a graded aluminum alloy, which is oxidized in a lateral direction. The oxidation changes the effective shape of the device according to the grading.

9 Claims, 2 Drawing Sheets

SEMICONDUCTOR SURFACE LENSES AND SHAPED STRUCTURES

CROSS REFERENCE TO RELATED APPLICATIONS

This application claims priority from U.S. Provisional Application Serial No. 60/046,054 filed May 9, 1997, the entirety of which is incorporated by reference herein.

STATEMENT AS TO FEDERALLY SPONSORED RESEARCH

This work was supported by Grant no DAAH04-96-1-0389, awarded by the US Army.

BACKGROUND AND SUMMARY

The present invention relates to techniques for formation of shaped structures on a semiconductor substrate. More particularly, one application of such shaped structures is to form structures which alter some aspect of an electromagnetic beam produced by the semiconductor. One example is a semiconductor lens.

Much interest has been recently placed on formation of optical structures using semiconductors. Semiconductor light emitting diodes ("LEDs") and vertical cavity surface emitting devices ("VCSELs") are known. These devices produce electromagnetic radiation, e.g., Infra Red ("IR") radiation, or light, from a semiconductor device.

The light produced by the semiconductor device must be coupled from the semiconductor device into a light channeling element, as air or a light channeling fiber. However, the actual coupling of the light can cause internal reflection at the interface between the semiconductor light emitting device and the medium such as air. In certain cases, the light can be totally internally reflected, resulting in very low coupling efficiency.

It is known to use a lensing element as part of a semiconductor. For example, U.S. Pat. No. 5,023,447 explains that it is desirable to use a semispherical lens in a semiconductor. However, the lens is separately formed and glued into place.

The present disclosure describes formation and use of a optical property altering device, e.g., a lens, out of a portion of the semiconductor substrate.

For example, the device as described herein forms a hemispherical cap at the top surface. This hemispherical cap acts as a lens to alter the optical characteristics.

BRIEF DESCRIPTION OF THE DRAWINGS

These and other aspects of the invention will now be described with reference to the attached drawings, in which.

DESCRIPTION OF THE EMBODIMENTS

Figure 1:
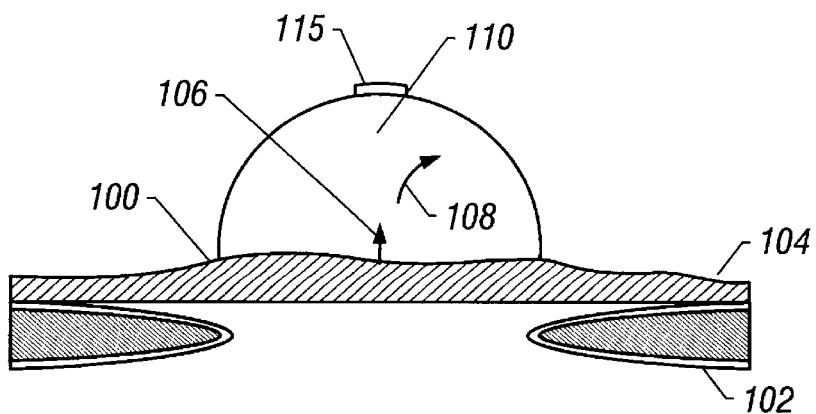
FIG. 1 shows an overall view of the device including a light source and a formed semiconductor lens.

FIG. 1 shows a cross section of a typical light emitting device with an integrally formed semiconductor lens. The term integrally means that the lens is part of a layer of the semiconductor device, and hence is attached as part of the device without any external means such as glueing as necessary in certain prior art.

Light emitting region 100 corresponds to a light emitting active region, which can be a light emitting diode ("LED"), a VCSEL, or any other semiconductor light emitting structure which can be formed using semiconductor techniques.

Part of the device may include semiconductor islands 102 which are formed by selective oxidation or ion implantation. These islands can be light emitting regions or other active semiconductor regions.

The light emitting region preferably uses $Al_xGa_{1-x}As$ as one of its active materials. The light emitting device 100 is electrically connected through top contacts 104.

The light is emitted from the semiconductor device at light emitting areas shown generally as 106. It should be understood that light can be emitted over a very wide or very narrow area depending on the nature of the device being fabricated. This embodiment describes using a hemispherical lensing element over the device to focus the light from the light emitting region. However, more generally, any property that can be altered by the shape of an element can be altered using the lensing element. The electromagnetic radiation that is produced can be light, including visible light, IR light or UV light, or any other radiation.

A hemisphere 110 of a specific material which can change some optical characteristic of the emitted light 108 is formed covering the light emitting area 106. The hemisphere 110 is generically referred to as a lens, which connotes that it can have any desired shape, and is not limited to hemispherical in shape.

The lens 110 can have any desired optical effect as known to those having ordinary skill in the art. Preferably, the lens 110 has at least one effect of minimizing refractive reflection at the light emitting area 106.

The lens assembly is formed as shown in FIGS. 2A–2D. Initially, in FIG. 2A, a graded $Al_xGa_{1-x}As$ alloy is epitaxially grown. The alloy is graded to have an increasing x, and hence increasing aluminum concentration, in the direction of the arrow 200. Hence the alloy has a larger concentration of aluminum at the top portion 202 than at the bottom portion 204. The amount of oxidation of such an alloy is dependent on the aluminum concentration. Hence, the grading of aluminum concentration forms an alloy which will be oxidized by different amounts depending on the aluminum concentration. The device is then covered with a very thin layer, e.g. a monolayer, of GaAs 208.

Figure 2A:
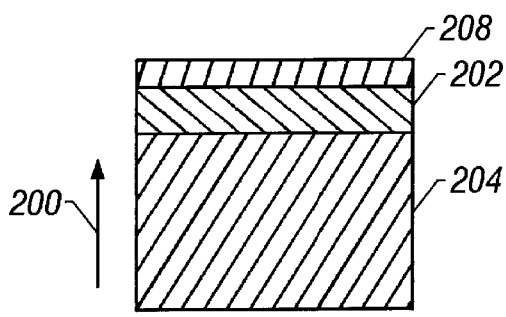
FIGS. 2A–2D show the fabrication process for a surface hemisphere.
Figure 2B:
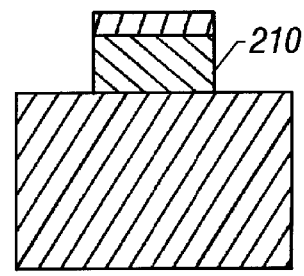

FIG. 2B illustrates forming the desired lens shape portion into a mesa 210 using standard photolithographic and etching techniques. The preferred system uses standard ultraviolet photolithographic techniques. This forms a substantially cylindrical mesa, which is rectangular in cross section mesa as shown in FIG. 2B.

The device is then oxidized. The oxidization rate is exponentially dependent on the aluminum concentration of the $Al_xGa_{1-x}As$ alloy. The unoxidized material has different optical properties than the oxidized material. This has the effect of forming a lens device depending on the profile of the concentration. The modified aluminum concentration can be used to yield any desired lens shape.

Figure 2C:
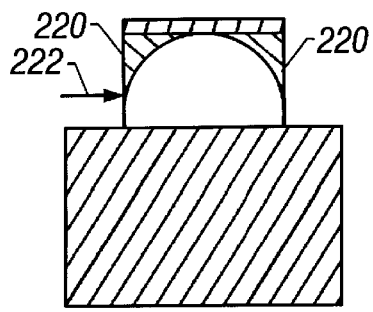

FIG. 2C shows the oxidation process which forms an oxidized portion 220 within the mesa 210. The oxidation is carried out preferably in the lateral plane 222 by virtue of the shielding effect of the GaAs layer 208. The lateral oxidation depends on the aluminum concentration. Since there is more aluminum at the top portion, more of the alloy is oxidized at that top portion. Hence, the oxidation shows a varying profile, where the depth of the oxidized portion 220 varies along the length as a function of the amount of aluminum concentration in that portion.

The FIG. 2C etching preferably uses wet oxidation in a furnace held at 425° C. with nitrogen gas bubbled through water at around 90° C. for around 5 minutes; the exact time depends on the particular structure being fabricated. The sample is then removed from the oxidation furnace, allowed to cool, and then placed back in the furnace for 30 seconds. This thermal cycling facilitates subsequent oxide removal.

Figure 2D:
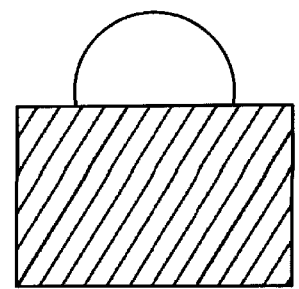

FIG. 2D shows the optional final step of removing the oxide 220 by dipping the structure in hydrofluoric acid. This leaves the structure shown in FIG. 2D with a hemispherically shaped structure operating as a lens.

Figure 3:
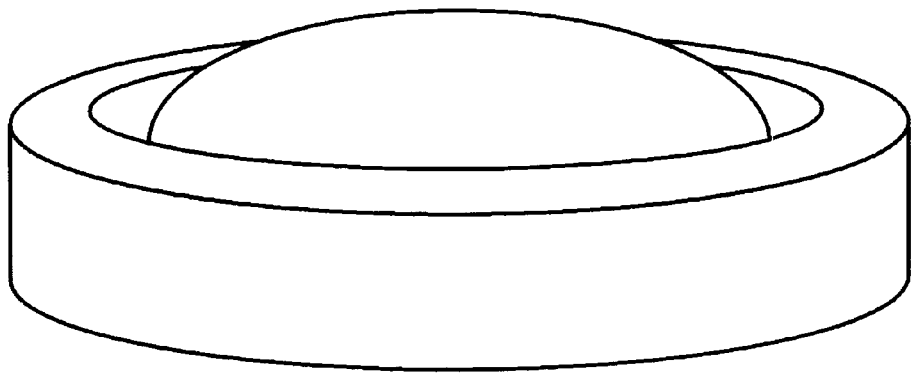
FIG. 3 is a drawing of an SEM micrograph of an actual surface lens.

A drawing of an SEM micrograph of surface lens fabricated with this procedure is shown in FIG. 3. This shows that the surface has a characteristic of a desired shape.

Although only a few embodiments have been described in detail above, other embodiments are contemplated by the inventor and are intended to be encompassed within the following claims. In addition, other modifications are contemplated and are also intended to be covered. For example, other materials could certainly be used and are within the disclosed system. Any material that is optically transmissive and can be selectively etched can be used. Also, other shapes, based on other concentration profile gradients, can be used.

What is claimed is:

1. A semiconductor system, comprising:

a substrate, having an optically active portion which emits light, and an optical modifying portion formed to have a flat lower portion over the optically active portion and a non-flat upper surface to have a lensing effect, which modifies some aspect of light transmitted by the optically active region, the optical modifying portion having a material composition that spatially increases within said optical modifying portion from a position near the optically active portion to the non-flat upper surface.

2. A system as in claim 1 wherein said optical modifying portion is formed of a material containing aluminum.

3. A system as in claim 2 wherein said optical modifying portion is formed of $Al_xGa_{1-x}As$.

4. A system as in claim 3, wherein a concentration of Al increases within said optical modifying portion from a position near the optically active portion to the non-flat upper portion.

5. A system as in claim 1, wherein said optical modifying portion is formed of a material which is oxidized depending on a percentage of a constituent material thereof.

6. A system as in claim 5, wherein said optical modifying portion has a graded concentration of said constituent material.

7. A light emitting semiconductor, comprising:

a first layer that emits light in an upward direction; and a second layer, integral with said first layer, and formed into the shape of a lens with a curved surface away from said first layer to change a characteristic of the light emitted by said first layer, said second layer including a metal whose concentration is spatially graded so as to increase from a position near said first layer to a position away from said first layer.

8. A semiconductor as in claim 7, wherein said first layer includes a LED or a VCSEL.

9. A semiconductor as in claim 7, wherein said second layer includes $Al_xGa_{1-x}As$ and a concentration of Al is graded.

* * * * *